United States Patent
Taniguchi et al.

(10) Patent No.: US 12,176,141 B2
(45) Date of Patent: Dec. 24, 2024

(54) MAGNET UNIT AND METHOD FOR MANUFACTURING THE SAME

(71) Applicants: DAIDO ELECTRONICS CO., LTD., Nakatsugawa (JP); AISIN CORPORATION, Kariya (JP)

(72) Inventors: Shotaro Taniguchi, Nakatsugawa (JP); Yasuhide Usui, Nakatsugawa (JP); Kazuki Hamada, Kariya (JP); Takanori Tsuzuki, Kariya (JP); Yoshifumi Ohashi, Kariya (JP)

(73) Assignees: DAIDO ELECTRONICS CO., LTD., Gifu (JP); AISIN CORPORATION, Aichi (JP)

( * ) Notice: Subject to any disclaimer, the term of this patent is extended or adjusted under 35 U.S.C. 154(b) by 0 days.

(21) Appl. No.: 17/747,273

(22) Filed: May 18, 2022

(65) Prior Publication Data

US 2022/0375669 A1 Nov. 24, 2022

(30) Foreign Application Priority Data

May 19, 2021 (JP) .................................. 2021-084460

(51) Int. Cl.
*H01F 7/02* (2006.01)
(52) U.S. Cl.
CPC ........... *H01F 7/0221* (2013.01); *H01F 7/021* (2013.01); *H01F 7/0294* (2013.01)
(58) Field of Classification Search
CPC .................................................... H01F 7/0294
USPC .................................................. 335/209, 285
See application file for complete search history.

(56) References Cited

U.S. PATENT DOCUMENTS

| | | | | | |
|---|---|---|---|---|---|
| 4,265,002 | A | * | 5/1981 | Hosken | A41F 1/002 24/303 |
| 5,152,035 | A | * | 10/1992 | Morita | A41F 1/002 24/303 |
| 5,473,799 | A | * | 12/1995 | Aoki | E05C 19/16 24/66.1 |
| 5,865,482 | A | * | 2/1999 | Aoki | A45C 13/1069 24/303 |
| 5,999,074 | A | * | 12/1999 | Coleman, Jr. | H01F 7/0257 294/65.5 |

(Continued)

FOREIGN PATENT DOCUMENTS

| | | |
|---|---|---|
| JP | S55-159510 U | 11/1980 |
| JP | H06-331384 A | 12/1994 |

(Continued)

OTHER PUBLICATIONS

Japanese Office Action, dated May 31, 2022, in Japanese Application No. 2021-084460 and English Translation thereof.

*Primary Examiner* — Alexander Talpalatski
(74) *Attorney, Agent, or Firm* — MCGINN I.P. LAW GROUP, PLLC

(57) ABSTRACT

The present invention relates to a magnet unit including: a tubular holder having a central axis; and a magnet formed inner region of one end side of the tubular holder, in which the magnet includes a protruding portion at a corner portion where an end surface of the magnet in a central axis direction intersects with an outer peripheral surface of the magnet, which is provided along an inner peripheral surface of the tubular holder, and the protruding portion protrudes in the central axial direction.

11 Claims, 6 Drawing Sheets

(56) References Cited

U.S. PATENT DOCUMENTS

| | | | | |
|---|---|---|---|---|
| 6,392,517 | B1* | 5/2002 | Coleman, Jr. | H01F 7/0257 81/24 |
| 7,378,928 | B2* | 5/2008 | Chang | H01F 7/0257 294/65.5 |
| 7,847,446 | B2* | 12/2010 | Becker | G01P 1/04 310/68 B |
| 8,049,586 | B2* | 11/2011 | Feng | H01F 7/0231 446/92 |
| 8,152,040 | B2* | 4/2012 | Hamman | E02D 17/20 227/140 |
| 11,616,421 | B2* | 3/2023 | Mori | H01F 7/0221 310/68 B |
| 2003/0059139 | A1 | 3/2003 | Nakajima | |
| 2011/0050212 | A1* | 3/2011 | Henning | G01D 5/145 29/527.1 |
| 2013/0241538 | A1* | 9/2013 | Akabane | G01D 5/145 324/207.25 |
| 2018/0010927 | A1* | 1/2018 | Forthaus | G01D 5/145 |
| 2022/0099118 | A1 | 3/2022 | Suzuki et al. | |

FOREIGN PATENT DOCUMENTS

| | | |
|---|---|---|
| JP | 2005-121671 A | 5/2005 |
| JP | 2016-153765 A | 8/2016 |
| JP | 2016-205977 A | 12/2016 |
| JP | 2017-173035 A | 9/2017 |
| JP | 2018-044768 A | 3/2018 |
| JP | 2020-134509 A | 8/2020 |
| WO | WO 2020/170859 A1 | 8/2020 |
| WO | WO 2021/187074 A1 | 9/2021 |

\* cited by examiner

MAGNET UNIT AND METHOD FOR MANUFACTURING THE SAME

TECHNICAL FIELD

The present invention relates to a magnet unit used to measure a rotational position of a rotary body or the like, and a method for manufacturing the same.

BACKGROUND ART

A magnetic field detection device (magnetic senser) with a magnet is widely applied to measure a rotational position of a rotary body or the like. The magnetic field detection device is comprised of a magnet that is fixed to the rotary body, and a magnetic field detector that measures magnetic field strength from the magnet fixed on the rotary body.

As a method to fix the magnet to the rotary body, for example, as described in Patent Literature 1 below, a cylindrical shape, non-magnetic holder (hereinafter cylindrical holder) is used to fix the magnet on to the rotaly body. The magnet is placed inner region of the cylindrical holder before the assembly.

Patent Literature 1: JP-A-2016-153765

SUMMARY OF INVENTION

Relative position between the magnetic field detector and the magnet fixed to the rotary body is very important to measure the rotational position of the rotary body precisely. In the case where the rotary body is a part of automobile component, engine vibration or driving vibration can be an external force and cause of stress to the both cylindrical holder and the magnet for a long period of time. Accordingly, sufficient strength between the cylindrical holder and the magnet is required to prevent deformation or rattling due to the long term stress. On the other hand, in some cases, it is assumed to be difficult to ensure sufficient strength due to requirements such as dimensional restrictions, miniaturization, and cost reduction.

The present invention is made in view of the above-described circumstances, and an objective of the present invention is to provide a magnet unit that can increase the bonding strength between a holder and a magnet that is formed inner region of the holder, and a method for manufacturing the same.

As a result of intensive studies to solve the above-described problem, the present inventors conceived the present invention as follows.

(1) A magnet unit includes:
  a tubular holder having a central axis; and
  a magnet formed inner region of one end side of the tubular holder,
  in which the magnet includes a protruding portion at a corner portion where an end surface of the magnet in a central axis direction intersects with an outer peripheral surface of the magnet, which is provided along an inner peripheral surface of the tubular holder, and the protruding portion protrudes in the central axial direction.

According to the magnet unit of this aspect, a contact area between the holder and the magnet can be increased without significantly changing shapes of the holder and the magnet that constitute the magnet unit, and the bonding strength between the holder and the magnet can be increased.

(2) In the magnet unit defined in (1), the protruding portion may include: in a cross-sectional view along the central axis direction, an outer surface that extends in the central axial direction and is in contact with the tubular holder; and a tapered inner surface that separates from the central axis as going from the end surface toward a tip end of the protruding portion.

The protruding portion in such a form can be implemented by using a mold that has a tapered portion corresponding to the protruding portion, provided at a top end corner portion of a part of the mold that is inserted into the holder during injection molding. The tapered portion also has a function as a guide when the mold is inserted into the holder, and can prevent interference between the mold and the holder to improve the manufacturability of the magnet unit during injection molding.

(3) In the magnet unit defined in (1) or (2), the protruding portion may have an endless annular shape along the inner peripheral surface of the tubular holder.

According to the magnet unit of this aspect, the contact area between the holder and the magnet can be maximized in the circumferential direction.

(4) In the magnet unit defined in any one of (1) to (3), the tubular holder may include a groove extending along the center axis direction and opening on the other end side of the tubular holder.

According to the magnet unit of this aspect, the groove functions as an air vent that discharges air in the holder to the outside when a rotary body is fitted into the holder.

(5) In the magnet unit defined in any one of (1) to (3), the tubular holder may include a plurality of grooves, each extending along the center axis direction and opening on the other end side of the tubular holder.

According to the magnet unit of this aspect, the grooves function as air vents that more effectively discharge air in the holder to the outside when a rotary body is fitted into the holder.

(6) In the magnet unit defined in any one of (1) to (5), the tubular holder may include a projecting portion projecting radially inward from the inner peripheral surface in a substantially middle portion of the magnet in the center axis direction.

According to the magnet unit of this aspect, the magnet is prevented from slipping off from the holder.

(7) In the magnet unit defined in (6), the projecting portion may have an endless annular shape along the inner peripheral surface of the tubular holder.

According to the magnet unit of this aspect, the magnet is more effectively prevented from slipping off from the holder.

(8) In the magnet unit defined in any one of (1) to (5), the tubular holder may include a plurality of projecting portions, each projecting radially inward from the inner peripheral surface in a substantially middle portion of the magnet in the center axis direction.

According to the magnet unit of this aspect, the magnet is effectively prevented from slipping off from the holder and from rotating in the circumferential direction.

(9) A method for manufacturing a magnet unit as described in (2) or (3), includes:
  inserting a mold into the tubular holder to define a cavity in the tubular holder; and
  injecting a material of the magnet into the cavity to obtain a magnet molded body,
  in which the mold includes, at a top end corner portion of a part that is inserted into the tubular holder, a tapered portion corresponding to the protruding portion of the magnet.

According to the manufacturing method of this aspect, the tapered portion provided at the top end corner portion of the mold for forming the protruding portion in the magnet has a function as a guide when the mold is inserted into the holder, which can prevent interference between the mold and the holder and improve the manufacturability of the magnet unit during injection molding.

DESCRIPTION OF EMBODIMENTS

Next, a magnet unit according to an embodiment of the present invention will be described in detail with reference to the drawings.

Figure 1:
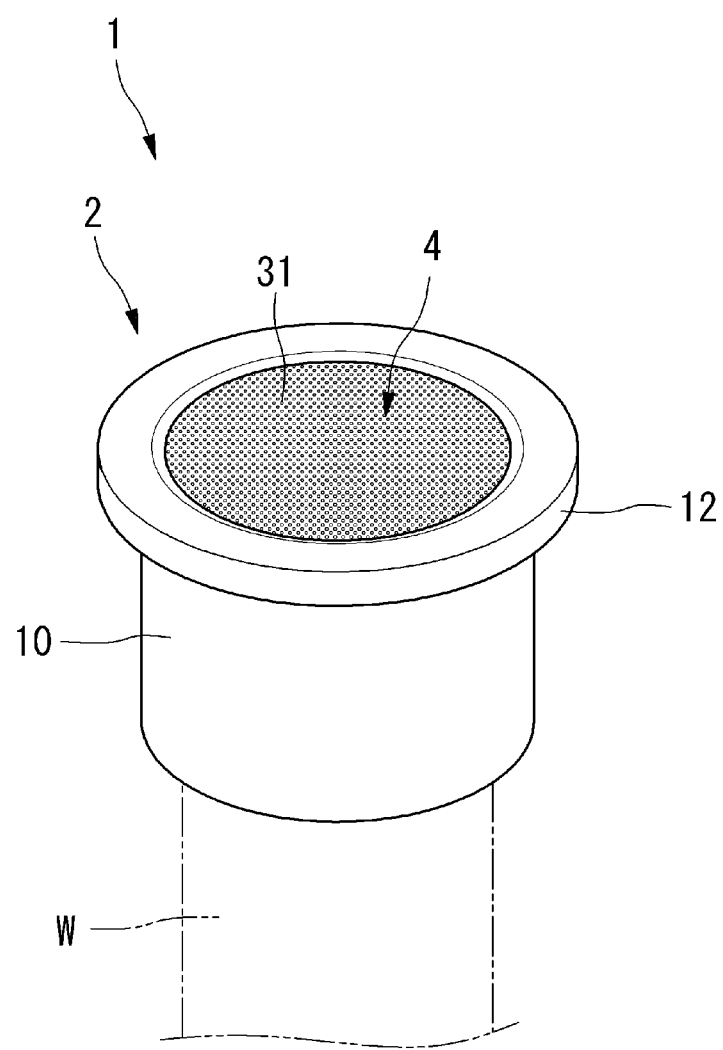
FIG. 1 is a perspective view of a magnet unit according to an embodiment of the present invention.
Figure 2A:
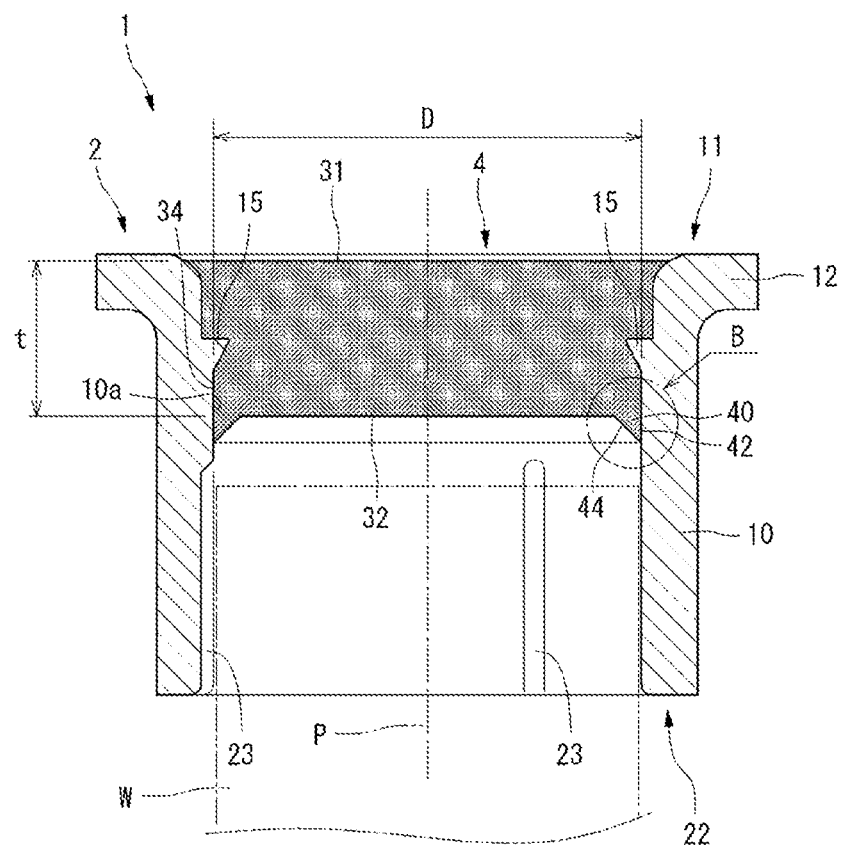
FIG. 2A is a longitudinal cross-sectional view of the magnet unit in FIG. 1.
Figure 2B:
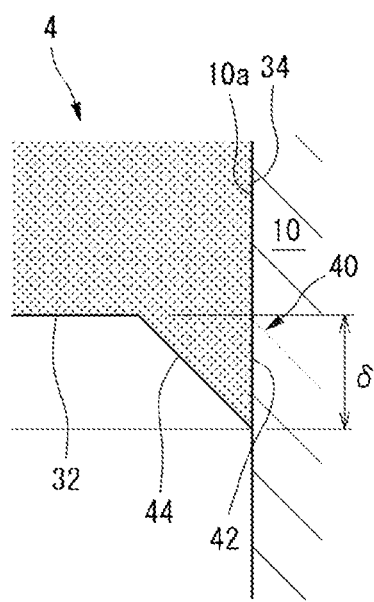
FIG. 2B is an enlarged view of a portion B in FIG. 2A.

FIG. 1 is a perspective view of a magnet unit 1 according to the embodiment of the present invention. FIG. 2A and FIG. 2B are longitudinal cross-sectional views of the magnet unit 1.

The magnet unit 1 of this embodiment is fixed to a rotary body W when measuring a rotational position of the rotary body W. The magnet unit 1 includes a cylindrical holder 2 and a magnet 4 formed inner region of the holder 2. The magnet 4 has been magnetized in such a manner that an N pole and an S pole exist in different positions in a circumferential direction around a central axis P. Alternatively, the magnet 4 may have been magnetized in such a manner that an N pole and an S pole exist in different positions in a thickness direction depending on situations.

The magnet unit 1 fixed to the rotary body W rotates together with the rotary body W when the rotary body W rotates. A change in a magnetic force at this time is detected by a magnetic field detector (not illustrated) disposed directly above an upward end surface 31 of the magnet 4, so that the rotational position of the rotary body W is measured.

Figure 3A:
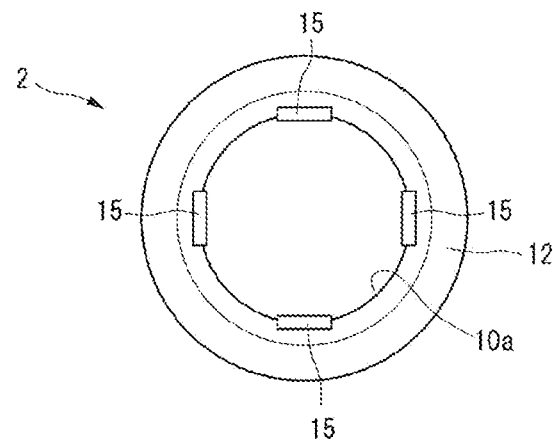
FIG. 3A is a plan view of a holder alone in FIG. 1.
Figure 3B:
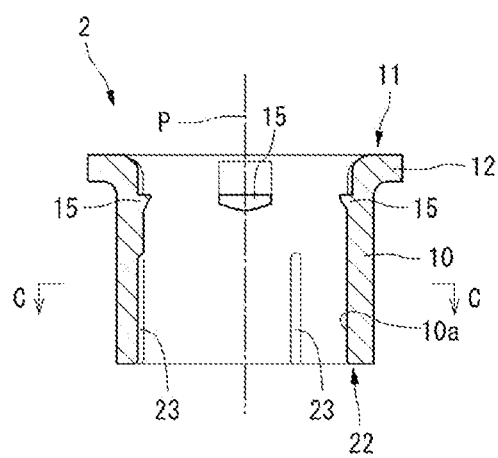
FIG. 3B is a longitudinal cross-sectional view of the holder in FIG. 3A.
Figure 3C:
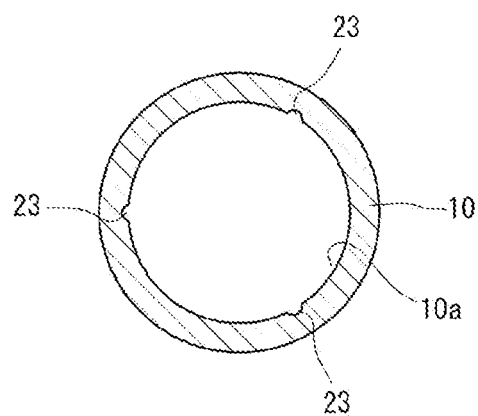
FIG. 3C is a cross-sectional view taken along a line C-C in FIG. 3B.

FIG. 3A to FIG. 3C illustrate the holder 2 alone that constitutes a part of the magnet unit 1. As illustrated in FIG. 3A to FIG. 3C, the holder 2 is a cylindrical member having both ends opened in an axial direction (central axis direction). The holder 2 includes a peripheral wall portion 10 having a straight shape in which an outer diameter and an inner diameter do not change along the axial direction. The holder 2 (specifically, the peripheral wall portion 10) includes an annular flange portion 12 extending radially outward on one end 11. The flange portion 12 has an effect of increasing the strength of the holder 2, and is effective for maintaining the cylindrical shape of the holder 2.

The one end 11-side of the holder 2, provided with the flange portion 12, is a side where the magnet 4 is formed, and a space for forming and holding the magnet 4 is defined inside the one end 11-side. A plurality of (here, four) projecting portions 15 are provided at intervals in the circumferential direction. The projecting portions 15 project radially inward (that is, toward the central axis P) from an inner peripheral surface 10a on the one end 11-side of the peripheral wall portion 10. The projecting portions 15 are provided to prevent the magnet 4 from slipping off. The projecting portions 15 are provided in substantially middle positions in the axial direction of the space in which the magnet 4 is formed.

On the other hand, the other end 22-side of the holder 2 is a side to be fitted to the rotary body W, and a space for accommodating the rotary body W is defined inside the other end 22-side. In the inner peripheral surface 10a on the other end 22-side of the peripheral wall portion 10, a plurality of (here, three) grooves 23 are provided at intervals in the circumferential direction. The grooves 23 extend toward an opening edge on the other end 22-side in the axial direction and open on the other end 22-side. The grooves 23 function as air vents that discharge air in the holder 2 to the outside when the rotary body W is fitted into the holder 2. The holder 2 may have only one groove 23, or may have a plurality of the grooves 23.

The holder 2 having the above-described configuration is preferably a non-magnetic material made of metal. Examples of the non-magnetic material include aluminum, copper, brass, and stainless steel. Alternatively, iron such as SPCC (steel plate cold commercial) or SUS420 may be used as the holder 2 when a magnetic circuit is intended.

Figure 6A:
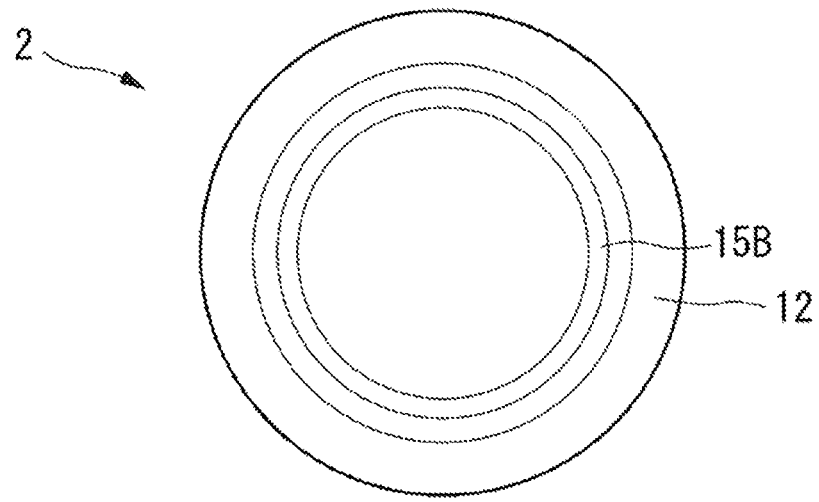
FIG. 6A is a plan view of a modification in which a projecting portion has an endless annular shape.
Figure 6B:
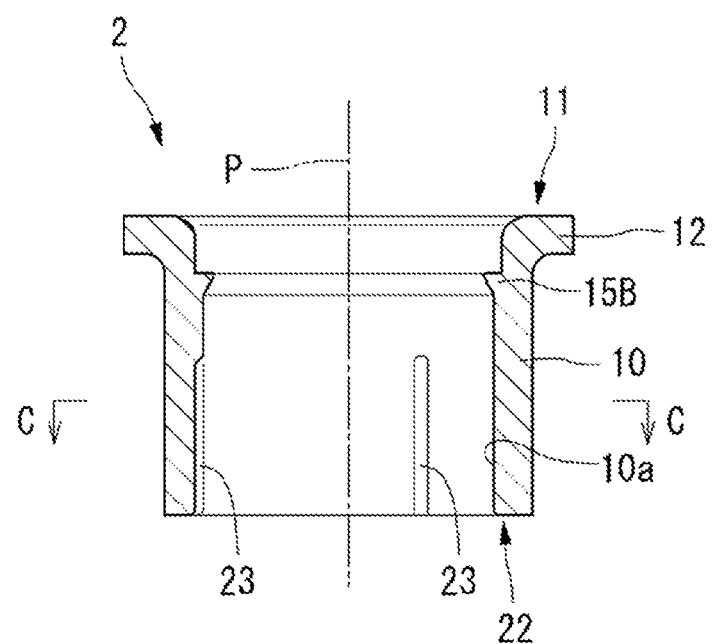
FIG. 6B is a longitudinal cross-sectional view of a projecting portion of the modification in FIG. 6A.

The length and the number of the projecting portions 15 formed on the holder 2 may be changed appropriately. FIG. 6A and FIG. 6B illustrate a modification of the projecting portion of the holder 2. In this modification, one projecting portion 15B is provided in an endless annular shape over the entire circumference of the inner peripheral surface 10a of the holder 2. A projecting shape of the projecting portion 15 may also be appropriately changed, and the number of the projecting portion may be increased or decreased as necessary. No projecting portion may be provided as long as the strength and fixation between the holder 2 and the magnet 4 can be ensured.

Next, the magnet 4 will be described. The magnet 4 according to the present embodiment is a bond magnet obtained by mixing a magnet material and a resin and injection-molding the mixture inside the holder 2. Examples of the magnet material include a magnetic material containing one or more rare earth elements such as Sm, Nd, and Pr, and for example, a SmFeN rare earth magnetic powder, a NdFeB rare earth magnetic powder, a ferrite magnetic powder, or a mixture thereof may be used.

Examples of the resin used for mixing with the magnet material include thermoplastic polyamide 12, polyamide 6, polyphenylene sulfide (PPS), polybutylene terephthalate (PBT), ethylene-vinylalcohol (EVA), polypropylene, and the like.

The magnet 4 has a substantially disc shape, and has, as illustrated in FIG. 2A and FIG. 2B, a first end surface 31 and a second end surface 32 provided at an interval in the axial direction. The first end surface 31 and the second end surface 32 extend in a direction intersecting with the central axis P (left-right direction in FIG. 2A). Here, the first end surface 31 is an end surface on an axially outer side and is provided near an end opening on the one end 11-side, and the second end surface 32 is an end surface on an axially inner side and is provided on the other end 22-side relative to the first end surface 31. An outer peripheral surface 34 that is in contact with the inner peripheral surface 10a of the holder 2 is provided between the first end surface 31 and the second end surface 32.

In the magnet 4, the projecting portions 15 of the holder 2 are embedded substantially in the middle of the outer peripheral surface 34 in the axial direction. In the present embodiment, the magnet 4 is prevented from slipping off in the axial direction and from rotating in the circumferential direction by the fitting between the projecting portions 15 and the magnet 4.

Furthermore, at a corner portion where the second end surface 32 located on the axially inner side intersects with the outer peripheral surface 34, a protruding portion 40 is provided in an endless annular shape along the inner peripheral surface 10a of the holder 2. The protruding portion 40 protrudes in the axial direction and expands a contact portion between the magnet 4 and the holder 2.

As illustrated in FIG. 2B, the protruding portion 40 includes: in a cross-sectional view along the central axis P, an outer surface 42 that extends in the axial direction and is in contact with the holder 2; and a tapered inner surface 44 that separates from the central axis P as going from the second end surface 32 toward a tip end of the protruding portion 40. The protruding portion 40 has a substantially triangular cross section, and the thickness of the protruding portion 40 gradually decreases from a base end toward the tip end thereof.

In the magnet unit 1 including the magnet 4 having the protruding portion 40 according to the present embodiment, the contact portion between the magnet 4 and the holder 2 is expanded by a length δ in the axial direction indicated in FIG. 2B as compared with a virtual case in which no protruding portion 40 is provided. Accordingly, the bonding strength between the holder 2 and the magnet 4 can be increased. For example, in the case where the magnet 4 has a diameter D of 7 mm to 10 mm and a thickness t of 2 mm to 4 mm, in the present embodiment, the axial length δ of the protruding portion 40 can be set in a range of 0.3 mm to 2.0 mm, and more preferably in a range of 0.5 mm to 1.0 mm.

Figure 4A:
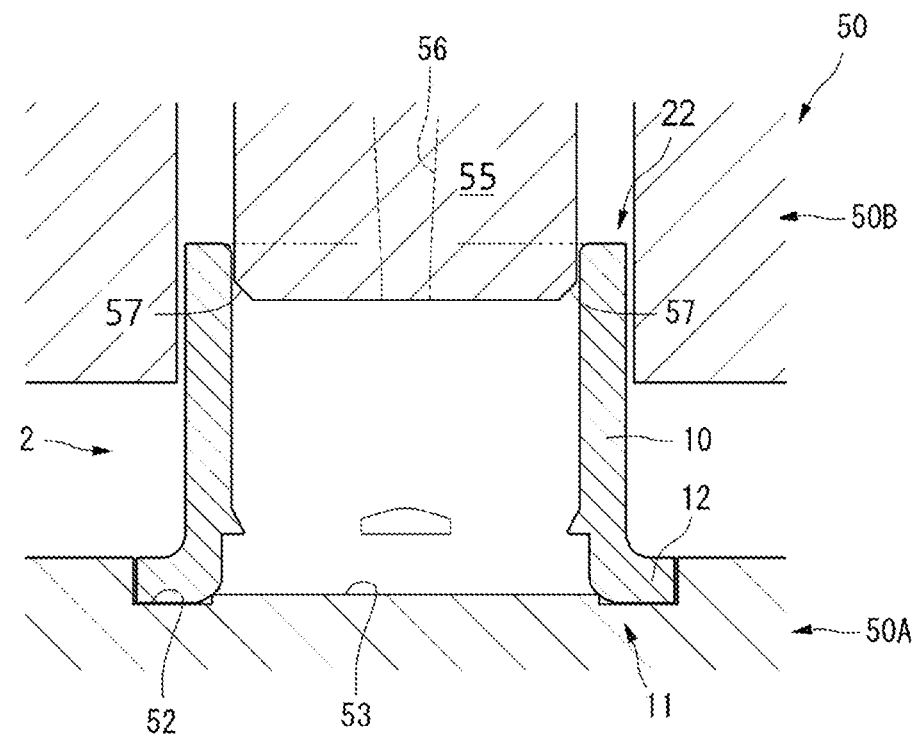
FIG. 4A and FIG. 4B are schematic views explaining a method for manufacturing the magnet unit in FIG. 1.
Figure 4B:
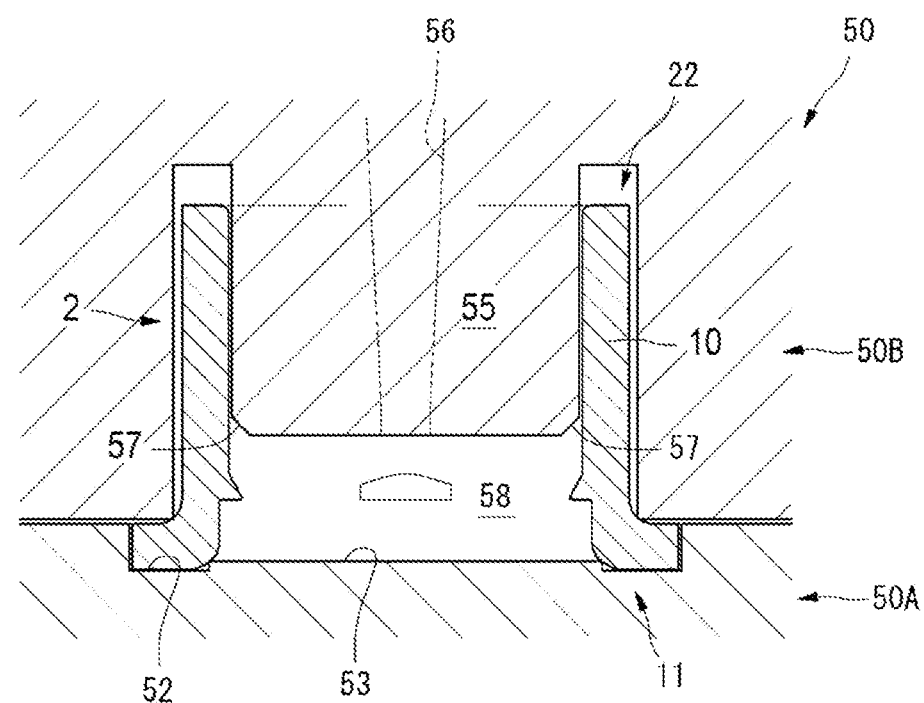
Figure 5:
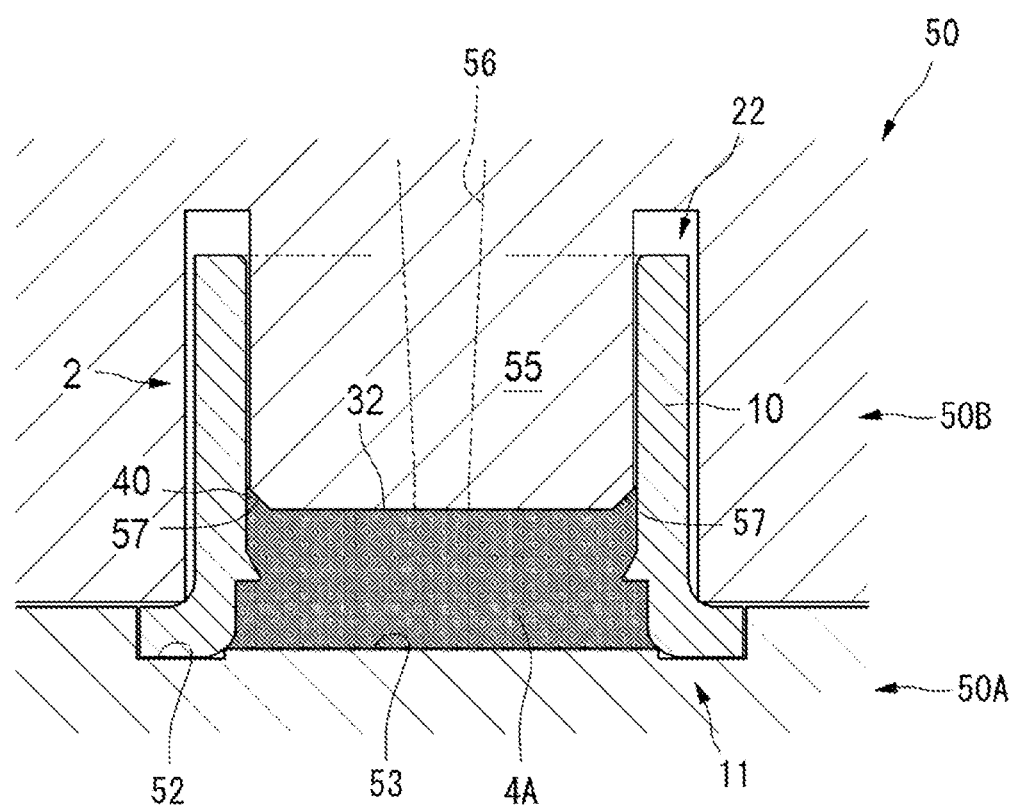
FIG. 5 is a schematic view explaining the method for manufacturing the magnet unit, following FIG. 4B.

A method for manufacturing the magnet unit 1 according to the present embodiment will be described with reference to FIG. 4A, FIG. 4B and FIG. 5. In FIG. 4A, FIG. 4B and FIG. 5, a reference sign 50 denotes a mold. The mold 50 is divided into a first split mold 50A and a second split mold 50B that are split in the axial direction of the magnet unit 1.

The first split mold 50A is a mold that is located below the holder 2 and supports the holder 2. The first split mold 50A includes an annular recessed groove 52 for positioning and a bottom surface portion 53 that is located inside the first split mold 50A and protrudes upward from the recessed groove 52. The second split mold 50B includes a columnar molding portion 55 that is inserted into the holder 2 from above (from the other end 22-side) the holder 2. The columnar molding portion 55 includes, at a top end corner portion, a tapered portion 57 corresponding to the protruding portion 40 provided on the magnet 4.

First, as illustrated in FIG. 4A, the holder 2 processed into a predetermined shape is placed in a state in which the flange portion 12 faces downward, and the flange portion 12 is fitted into the recessed groove 52 provided in the first split mold 50A. At this time, the end opening on the one end 11-side of the holder 2 is blocked by the bottom surface portion 53 of the first split mold 50A.

Subsequently, the columnar molding portion 55 of the second split mold 50B is inserted into the holder 2 from an end opening of the holder 2 on the other end 22-side that is opened upward. Then, in a state where the first split mold 50A and the second split mold 50B are closed, as illustrated in FIG. 4B, a cavity 58 is defined by the holder 2, the bottom surface portion 53 of the first split mold 50A, and the molding portion 55 of the second split mold 50B.

The molding portion 55 of the second split mold 50B is provided with, in a central portion thereof, a passage 56 for injecting a magnet material (material for the bond magnet). When the magnet material is injected into the cavity 58 through the passage 56, a magnet molded body 4A is obtained inside the holder 2 as illustrated in FIG. 5. An uplift portion (not illustrated) due to the remaining gate may be formed at a connection portion between the second end surface 32 of the formed magnet molded body 4A and the passage 56.

Thereafter, the obtained magnet molded body 4A is magnetized to obtain the magnet 4, so that the magnet unit 1 according to the present embodiment is obtained.

As described above, according to the magnet unit 1 of the present embodiment, the protruding portion 40 protruding in the axial direction and expanding the contact portion between the holder 2 and the magnet 4 is provided at the corner portion of the magnet 4 where the second end surface 32 extending in the direction intersecting the central axis P intersects with the outer peripheral surface 34 provided along the inner peripheral surface 10a of the holder 2. Therefore, a contact area between the holder 2 and the magnet 4 can be increased without largely changing shapes of the holder 2 and the magnet 4 that constitute the magnet unit 1, and the bonding strength between the holder 2 and the magnet 4 can be increased.

In the magnet unit 1 of the present embodiment, the protruding portion 40 includes, in a cross-sectional view along the central axis P, the outer surface 42 that extends in the axial direction and is in contact with the holder 2 and the tapered inner surface 44 that separates from the central axis P as going from the second end surface 32 toward the tip end of the protruding portion 40.

The protruding portion 40 in such a form can be implemented by providing the tapered portion 57 corresponding to the protruding portion 40 at the top end corner portion of the molding portion 55 of the second split mold 50B that is inserted into the holder 2 during injection molding. The tapered portion 57 also has a function as a guide when the second split mold 50B is inserted into the holder 2, and can prevent interference between the second split mold 50B and the holder 2 and improve the manufacturability during injection molding.

In the magnet unit 1 of the present embodiment, the contact area between the holder 2 and the magnet 4 can be maximized in the circumferential direction by providing the protruding portion 40 in an endless annular shape along the inner peripheral surface 10a of the holder 2.

Although the embodiment of the present invention is described in detail above, the present invention is not limited thereto, and various modifications can be made without departing from the spirit of the present invention. For example, although the cylindrical holder is used in the above-described embodiment, a tubular member having a polygonal cross-section or oval cylindrical member may be used as the holder. In the case where the tubular member has a cross-section other than circle, the magnet has a cross-section corresponding to that of the tubular member. In addition, other various modifications are also included in the present invention without departing from the scope of the claims, and for example, the holder may have a shape in which the other end side to be fitted to the rotary body is reduced or increased in diameter relative to the one end side.

The present application is based on Japanese Patent Application No. 2021-084460 filed on May 19, 2021, the contents thereof being hereby incorporated by reference.

REFERENCE SIGNS LIST 1 magnet unit
2 holder
4 magnet (bond magnet)
4A magnet molded body
10a inner peripheral surface
15 projecting portion
32 second end surface
34 outer peripheral surface
40 protruding portion
42 outer surface
44 inner surface
50A, 50B split mold (mold)
57 tapered portion
58 cavity
P central axis

What is claimed is:

1. A magnet unit comprising:
a tubular holder having a central axis, the tubular holder including:
  a peripheral wall portion having a straight shape along the central axis; and
  an annular flange extending radially outward from the central axis; and
a magnet formed in an inner region of one end side of the tubular holder,
wherein the tubular holder comprises a groove extending along the central axis and opening on an other end side of the tubular holder,
wherein the tubular holder includes a nonmagnetic material made of metal,
wherein the magnet comprises a protruding portion at a corner portion where an end surface of the magnet facing the other end side of the tubular holder intersects with an outer peripheral surface of the magnet, which is provided along an inner peripheral surface of the tubular holder, and the protruding portion protrudes towards the other end side of the tubular holder,
wherein the magnet includes:
  a hole;
  a flare at the one end side of the tubular holder above the hole along the central axis; and
  a surface located between the hole and the flare, the surface extending parallel to the central axis,
wherein the magnet has a constant diameter except for a portion of the magnet on the one end side of the tubular holder where the hole and the flare are formed, and
wherein the annular flange has, in a cross-sectional view along the central axis, a round-chamfered inner shape at the opening of the tubular holder at the one end side.

2. The magnet unit according to claim 1, wherein the protruding portion comprises:
in a cross-sectional view along the central axis, an outer surface that extends in the central axial and is in contact with the tubular holder; and
a tapered inner surface that separates from the central axis as going from the end surface toward a tip end of the protruding portion.

3. The magnet unit according to claim 1, wherein the protruding portion has an endless annular shape along the inner peripheral surface of the tubular holder.

4. The magnet unit according to claim 1, wherein the tubular holder comprises a plurality of grooves, each extending along the central axis and opening on the other end side of the tubular holder.

5. The magnet unit according to claim 1, wherein the tubular holder comprises a projecting portion projecting radially inward from the inner peripheral surface in a substantially middle portion of the magnet in the central axis.

6. The magnet unit according to claim 5, wherein the projecting portion has an endless annular shape along the inner peripheral surface of the tubular holder.

7. The magnet unit according to claim 1, wherein the tubular holder comprises a plurality of projecting portions, each projecting radially inward from the inner peripheral surface in a substantially middle portion of the magnet in the central axis.

8. A method for manufacturing the magnet unit described in claim 2, the method comprising:
inserting a mold into the tubular holder to define a cavity in the tubular holder; and
injecting a material of the magnet into the cavity to obtain a magnet molded body,
wherein the mold comprises, at a top end corner portion of a part that is inserted into the tubular holder, a tapered portion corresponding to the protruding portion of the magnet.

9. The magnet unit according to claim 5, wherein the projecting portion has a shape where a surface on the one end side is perpendicular to the central axis and, in the cross-sectional view along the central axis, the projecting portion projects radially inward in an acute-angled manner.

10. The magnet unit according to claim 1, wherein an upper most portion of the groove is positioned along the central axis below the end surface of the magnet.

11. The magnet unit according to claim 1, wherein the magnet comprises a plurality of holes, and wherein each hole of the plurality of holes are spaced apart in a circumferential direction.

* * * * *